(12) United States Patent
Bangsaruntip et al.

(10) Patent No.: US 8,361,907 B2
(45) Date of Patent: Jan. 29, 2013

(54) DIRECTIONALLY ETCHED NANOWIRE FIELD EFFECT TRANSISTORS

(75) Inventors: Sarunya Bangsaruntip, Mount Kisco, NY (US); Guy M. Cohen, Mohegan Lake, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 27 days.

(21) Appl. No.: 12/776,485

(22) Filed: May 10, 2010

(65) Prior Publication Data

US 2011/0272673 A1    Nov. 10, 2011

(51) Int. Cl.
*H01L 29/72* (2006.01)
(52) U.S. Cl. ......... 438/739; 977/936; 438/151; 438/735
(58) Field of Classification Search .................. 438/151, 438/735, 739; 977/936
See application file for complete search history.

(56) References Cited

U.S. PATENT DOCUMENTS

| | | | |
|---|---|---|---|
| 4,995,001 A | 2/1991 | Dawson et al. |
| 5,308,445 A | 5/1994 | Takasu |
| 5,438,018 A | 8/1995 | Mori et al. |
| 5,552,622 A | 9/1996 | Kimura |
| 5,574,308 A | 11/1996 | Mori et al. |
| 5,668,046 A | 9/1997 | Koh et al. |
| 6,365,465 B1 | 4/2002 | Chan et al. |
| 6,642,115 B1 | 11/2003 | Cohen et al. |
| 6,653,209 B1 | 11/2003 | Yamagata |
| 6,806,141 B2 | 10/2004 | Kamins |
| 6,855,606 B2 | 2/2005 | Chen et al. |
| 6,882,051 B2 | 4/2005 | Majumdar et al. |
| 6,891,227 B2 | 5/2005 | Appenzeller et al. |
| 6,903,013 B2 | 6/2005 | Chan et al. |

(Continued)

FOREIGN PATENT DOCUMENTS

| | | |
|---|---|---|
| EP | 217811 A1 | 4/2010 |
| KR | 20090044799 A | 5/2009 |

(Continued)

OTHER PUBLICATIONS

G.W. Neudeck, "An Overview of Double-Gate MOSFETs," Proceedings of 15th Biennial University/Government/Industry Microelectronics Symposium. UGIM 2003. New York, NY: IEEE, US, Jun. 30-Jul. 2, 2003., pp. 214-217.

(Continued)

*Primary Examiner* — Edward Wojciechowicz
(74) *Attorney, Agent, or Firm* — Cantor Colburn LLP; Vazken Alexanian

(57) ABSTRACT

A method for forming a nanowire field effect transistor (FET) device includes depositing a first semiconductor layer on a substrate wherein a surface of the semiconductor layer is parallel to {110} crystalline planes of the semiconductor layer, epitaxially depositing a second semiconductor layer on the first semiconductor layer, etching the first semiconductor layer and the second semiconductor layer to define a nanowire channel portion that connects a source region pad to a drain region pad, the nanowire channel portion having sidewalls that are parallel to {100} crystalline planes, and the source region pad and the drain region pad having sidewalls that are parallel to {110} crystalline planes, and performing an anisotropic etch that removes primarily material from {100} crystalline planes of the first semiconductor layer such that the nanowire channel portion is suspended by the source region pad and the drain region pad.

15 Claims, 8 Drawing Sheets

U.S. PATENT DOCUMENTS

| | | | |
|---|---|---|---|
| 6,996,147 | B2 | 2/2006 | Majumdar et al. |
| 7,101,762 | B2 | 9/2006 | Cohen et al. |
| 7,151,209 | B2 | 12/2006 | Empedocles et al. |
| 7,180,107 | B2 | 2/2007 | Appenzeller et al. |
| 7,253,060 | B2 | 8/2007 | Yun et al. |
| 7,297,615 | B2 | 11/2007 | Cho et al. |
| 7,311,776 | B2 | 12/2007 | Lin et al. |
| 7,443,025 | B2 | 10/2008 | Verbist |
| 7,446,025 | B2 | 11/2008 | Cohen et al. |
| 7,449,373 | B2 | 11/2008 | Doyle et al. |
| 7,452,759 | B2 | 11/2008 | Sandhu |
| 7,452,778 | B2 | 11/2008 | Chen et al. |
| 7,456,068 | B2 | 11/2008 | Kavalieros et al. |
| 7,456,476 | B2 | 11/2008 | Hareland et al. |
| 7,473,943 | B2 | 1/2009 | Mostarshed et al. |
| 7,498,211 | B2 | 3/2009 | Ban et al. |
| 7,550,333 | B2 | 6/2009 | Shah et al. |
| 7,569,941 | B2 | 8/2009 | Majumdar et al. |
| 7,642,578 | B2 | 1/2010 | Lee et al. |
| 7,791,144 | B2 | 9/2010 | Chidambarrao et al. |
| 7,799,657 | B2 | 9/2010 | Dao |
| 7,803,675 | B2 * | 9/2010 | Suk et al. ............... 438/197 |
| 7,834,345 | B2 | 11/2010 | Bhuwalka et al. |
| 7,871,870 | B2 | 1/2011 | Mostarshed et al. |
| 7,893,506 | B2 | 2/2011 | Chau et al. |
| 2004/0149978 | A1 | 8/2004 | Snider |
| 2004/0166642 | A1 | 8/2004 | Chen et al. |
| 2005/0121706 | A1 | 6/2005 | Chen et al. |
| 2005/0266645 | A1 | 12/2005 | Park |
| 2005/0275010 | A1 | 12/2005 | Chen et al. |
| 2006/0033145 | A1 | 2/2006 | Kakoschke et al. |
| 2007/0001219 | A1 | 1/2007 | Radosavljevic et al. |
| 2007/0267619 | A1 | 11/2007 | Nirschl |
| 2007/0267703 | A1 | 11/2007 | Chong et al. |
| 2007/0284613 | A1 | 12/2007 | Chui et al. |
| 2008/0014689 | A1 | 1/2008 | Cleavelin et al. |
| 2008/0061284 | A1 | 3/2008 | Chu et al. |
| 2008/0067495 | A1 | 3/2008 | Verhulst |
| 2008/0067607 | A1 | 3/2008 | Verhulst et al. |
| 2008/0079041 | A1 | 4/2008 | Suk et al. |
| 2008/0085587 | A1 | 4/2008 | Wells et al. |
| 2008/0121932 | A1 | 5/2008 | Ranade |
| 2008/0128760 | A1 * | 6/2008 | Jun et al. ............... 257/280 |
| 2008/0135949 | A1 | 6/2008 | Lo et al. |
| 2008/0142853 | A1 | 6/2008 | Orlowski |
| 2008/0149914 | A1 | 6/2008 | Samuelson et al. |
| 2008/0149997 | A1 | 6/2008 | Jin et al. |
| 2008/0150025 | A1 | 6/2008 | Jain |
| 2008/0179752 | A1 | 7/2008 | Yamauchi et al. |
| 2008/0191196 | A1 | 8/2008 | Lu et al. |
| 2008/0224224 | A1 | 9/2008 | Vandenderghe et al. |
| 2008/0227259 | A1 | 9/2008 | Avouris et al. |
| 2008/0246021 | A1 | 10/2008 | Suk et al. |
| 2008/0247226 | A1 | 10/2008 | Liu et al. |
| 2008/0290418 | A1 | 11/2008 | Kalburge |
| 2009/0026553 | A1 | 1/2009 | Bhuwalka et al. |
| 2009/0057650 | A1 | 3/2009 | Lieber et al. |
| 2009/0057762 | A1 | 3/2009 | Bangsaruntip et al. |
| 2009/0061568 | A1 | 3/2009 | Bangsaruntip et al. |
| 2009/0090934 | A1 | 4/2009 | Tezuka et al. |
| 2009/0134467 | A1 | 5/2009 | Ishida et al. |
| 2009/0149012 | A1 | 6/2009 | Brask et al. |
| 2009/0181477 | A1 | 7/2009 | King et al. |
| 2009/0294864 | A1 | 12/2009 | Suk et al. |
| 2010/0193770 | A1 | 8/2010 | Bangsaruntip et al. |
| 2011/0133169 | A1 | 6/2011 | Bangsaruntip et al. |

FOREIGN PATENT DOCUMENTS

| | | |
|---|---|---|
| WO | 02084757 A1 | 10/2002 |
| WO | WO2008069765 A1 | 6/2008 |

OTHER PUBLICATIONS

International Search Report; International Application No. PCT/EP2010/066961; International Filing Date: Nov. 8, 2010; Date of Mailing: Feb. 10, 2011.

International Search Report; International Application No. PCT/EP2010/066483; International Filing Date: Oct. 29, 2010; Date of Mailing: Feb. 7, 2011.

International Search Report—Written Opinion; International Application No. PCT/EP2010/066483; International Filing Date: Oct. 29, 2010; Date of Mailing: Feb. 7, 2011.

International Search Report—Written Opinion; International Application No. PCT/EP2010/066961; International Filing Date: Nov. 8, 2010; Date of Mailing: Feb. 10, 2011.

Pavanello et al., "Evaluation of Triple-Gate FinFETs With SiO2-HfO2-TiN Gate Stack Under Analog Operation," Solid State Electronics, Elsevier Science Publishers, Barking, GB, vol. 51, No. 2, Mar. 7, 2007, pp. 285-291.

International Search Report; International Application No. PCT/EP2011/053174; International Filing Date: Mar. 3, 2011; Date of Mailing: May 31, 2011.

International Search Report—Written Opinion; International Application No. PCT/EP2011/053174; International Filing Date: Mar. 3, 2011; Date of Mailing: May 31, 2011.

Alexander J. Gates, "Designing a Nanoelectronic Circuit to Control a Millimeter-scale Walking Robot," Mitre Technical Paper, Nov. 2004, http://www.mitre.org/work/tech_papers/tech_papers_04/04_1248/04_1248.pdf.

Andriotis et al., Realistic nanotube-metal contact configuration for molecular electronics applications, IEEE Sensors Journal, vol. 8, No. 6, Jun. 2008.

R. Bahar, 'Trends and Future Directions in Nano Structure Based Computing and Fabrication', ICCD 2006, International Conf. on Computer Design, Oct. 1-4, 2007, pp. 522-527.

Buddharaju et al., 'Gate-All-Around Si-Nanowire CMOS Inverter Logic Fabricated Using Top-Down Approach', European Solid-State Device Research Conference, Sep. 11-11, 2007, pp. 303-306.

Chen et al., 'Demonstration of Tunneling FETs Based on Highly Scalable Verticle Silicon Nanowires', IEEE Electron Device Letters, vol. 30, No. 7, Jul. 2009, pp. 754-756.

Ernst et al., "3D Multichannels and Stacked Nanowires Technologies for New Design Opportunities in Nanoelectronics," IEEE International Conference on Integrated Circuit Design and Technology and Tutorial, 2008. ICICDT 2008. Jun. 2-4, 2008 pp. 265-268.

Hu et al., 'Fringing field effects on electrical resistivity of semiconductor nanowire-metal contacts', Applied Physics Letters 92, 083503_2008.

Jie Xiang et al., "Ge/Si Nanowire Heterostructures as High-Performance Field-Effect Transistors," Nature 441, 489-493 (May 25, 2006).

Knoch et al., 'Tunneling phenomena in carbon nanotube field-effect transistors', Phys Stat Sol. (a) 205, No. 4, 679-694 (2008).

Leonard et al., 'Size-dependent effects on electrical contacts to nanotubes and nanowires', Phys Rev Lett., Jul. 14, 2006; 97(2):026804.

M. M. Ziegler et al., "The CMOS/NANO Interface from a Circuits Perspective," ISCAS '03. Proceedings of the 2003 International Symposium on Circuits and Systems, 2003, May 25-28, 2003, vol. 4, pp. IV-904-IV-907.

M. T. Bjork et al., "Silicon Nanowire Tunneling Field-Effect Transistors," Applied Physics Letters 92, 193504 (2008).

Ma et al., 'High-performance nanowire complementary metal-semiconductor inverters', Applied Physics Letters 93, 053105_2008.

Saumitra Raj Mehrotra, A Simulation Study of Silicom Nanowire Field Effect Transistors (FETs), University of Cincinnati, Jul. 2007.

Singh et al., 'Si, SiGe Nanowire Devices by Top-Down Technology and Their Applications', IEEE Transactions on Electron Devices, vol. 55, No. 11, Nov. 2008, pp. 3107-3118.

Taichi Su et al., New Planar Self-Aligned Double-Gate Fully Depleted P-MOSFET's Using Epitaxial Lateral Overgrowth (ELO) and Selectively Grown Source/Drain (SID).

N. Checka, 'Circuit Architecture for 3D Integration', Chapter 13 in Wafer Level 3-D ICs Process Technology, ed. C.S. Tan, Springer US, 2008, ISBN 978-0-387-76534-1.

International Search Report; International Application No. PCT/US2011/029304; International Filing Date: Mar. 22, 2011; Date of Mailing: May 20, 2011.

International Search Report—Written Opinion; International Application No. PCT/US2011/029304; International Filing Date: Mar. 22, 2011; Date of Mailing: May 20, 2011.

International Search Report; International Application No. PCT/US11/49501; International Filing Date: Aug. 29, 2011; Date of Mailing: Jan. 18, 2012.

International Search Report Written Opinion; International Application No. PCT/US11/49501; International Filing Date: Aug. 29, 2011; Date of Mailing: Jan. 18, 2012.

Checka, N. 'Circuit Architecture for 3D Integration', Chapter 13 in Wafer Level 3-D ICs Process Technology, ed. C.S. Tan, Springer US, 2008, ISBN 978-0-387-76534-1.

Lauhon et al., 'Epitaxial core-shell and core-multishell nanowire heterostructures', Nature, vol. 420, Nov. 7, 2002, pp. 57-61.

Office Action—Non-Final for U.S. Appl. No. 12/778,315, filed May 12, 2010; First Named Inventor: Sarunya Bangsaruntip; Mailing Date: Mar. 26, 2012.

Restriction/Election Office Action for U.S. Appl. No. 12/758,939, filed Apr. 13, 2010; First Named Inventor: Sarunya Bangsaruntip; Mailing Date: Jun. 8, 2012.

* cited by examiner

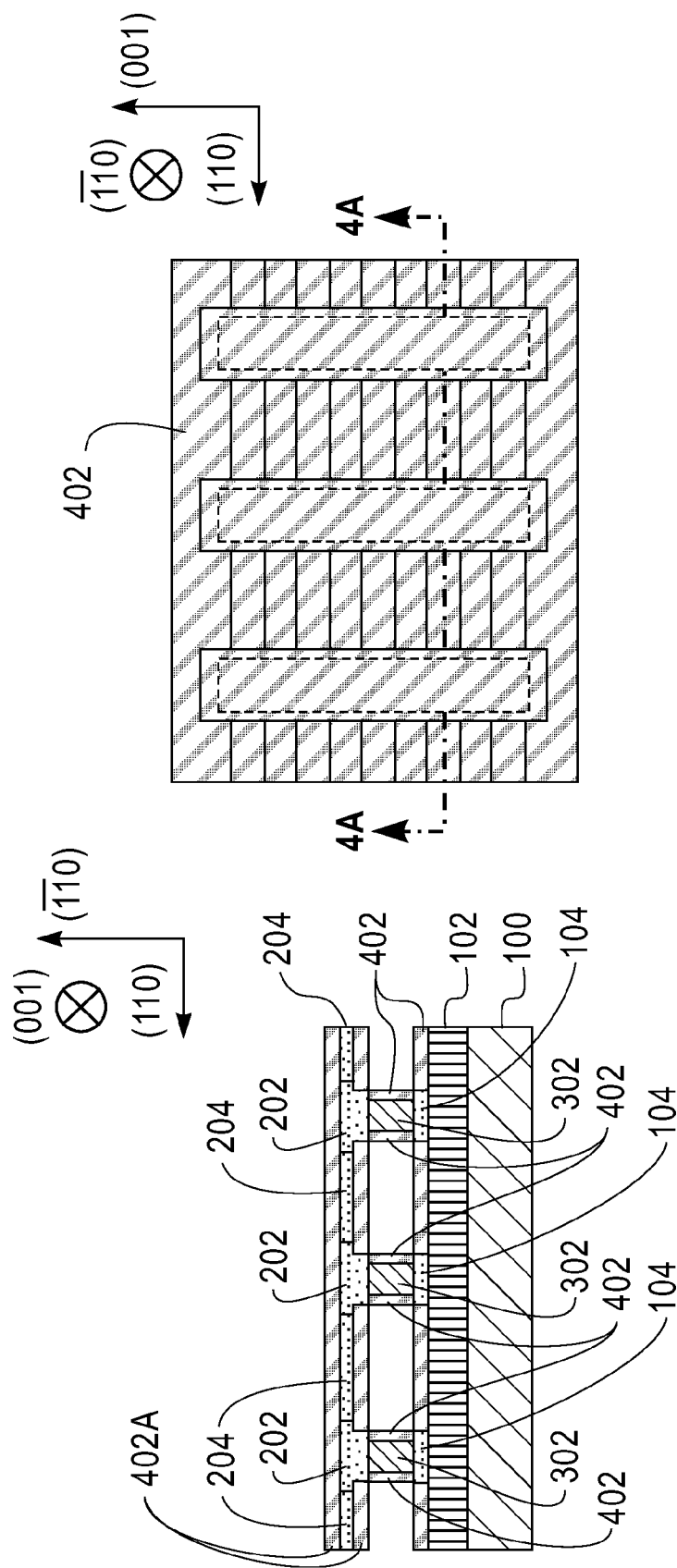

DIRECTIONALLY ETCHED NANOWIRE FIELD EFFECT TRANSISTORS

FIELD OF INVENTION

The present invention relates to semiconductor nanowire field effect transistors and to methods that allow the fabrication of nanowire field effect transistors in a dense array.

DESCRIPTION OF RELATED ART

The fabrication of a nanowire field effect transistor (FET) with a gate conductor surrounding the nanowire channel (also known as a gate-all-around nanowire FET) includes suspension of the nanowires. Suspension of the nanowires allows for the gate conductor to cover all surfaces of the nanowires.

The fabrication of a gate-all-around nanowire FET typically includes the following steps: (1) Definition of the nanowires between source and drain regions by patterning a silicon-on-insulator (SOI) layer. (2) Suspension of the nanowires by isotropic etching that undercuts the insulator on which the nanowires are resting. This etching step also undercuts the insulator at the edge of the source and drain region. The overhang/undercut that forms may not be a desirable outcome. (3) A blanket and conformal deposition of the gate conductor. The gate conductor warps around the suspended nanowires but also fills the undercut at the edge of the source and drain regions. (4) Definition of the gate line which includes the etching of the gate line and removal of gate conductor material from all regions outside the gate line, including gate material deposited in the cavities at the edge of the source and drain regions.

BRIEF SUMMARY

In one aspect of the present invention, a method for forming a nanowire field effect transistor (FET) device includes depositing a first semiconductor layer on a substrate wherein a surface of the semiconductor layer is parallel to {110} crystalline planes of the semiconductor layer, epitaxially depositing a second semiconductor layer on the first semiconductor layer, etching the first semiconductor layer and the second semiconductor layer to define a nanowire channel portion that connects a source region pad to a drain region pad, the nanowire channel portion having sidewalls that are parallel to {100} crystalline planes, and the source region pad and the drain region pad having sidewalls that are parallel to {110} crystalline planes, and performing an anisotropic etch that removes primarily material from {100} crystalline planes of the first semiconductor layer such that the nanowire channel portion is suspended by the source region pad and the drain region pad.

In another aspect of the present invention, a method for forming a nanowire field effect transistor (FET) device includes disposing a crystalline layer on a substrate, disposing a silicon layer on the crystalline layer, etching the portions of the silicon layer and the crystalline layer to define a nanowire portion in the silicon layer having a longitudinal orientation along a lattice plane (110) of the crystalline layer, the nanowire portion connected to a first anchor portion having a longitudinal orientation along a lattice plane (001) of the crystalline layer and a second anchor portion having a longitudinal orientation along the lattice plane (001) of the crystalline layer, anisotropically etching to primarily remove the crystalline layer under the nanowire portion and marginally etching a portion of the crystalline layer under the first anchor portion and a portion of the crystalline layer under the second anchor portion, and forming a gate structure on a channel region of the nanowire.

In yet another aspect of the present invention, a nanowire field effect transistor (FET) device includes a source region comprising a first semiconductor layer disposed on a second semiconductor layer, the source region having a surface parallel to {110} crystalline planes and opposing sidewall surfaces parallel to the {110} crystalline planes, a drain region comprising the first semiconductor layer disposed on the second semiconductor layer, the source region having a face parallel to the {110} crystalline planes and opposing sidewall surfaces parallel to the {110} crystalline planes, a nanowire channel member suspended by the source region and the drain region, wherein nanowire channel includes the first semiconductor layer, and opposing sidewall surfaces parallel to {100} crystalline planes and opposing faces parallel to the {110} crystalline planes.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1A-8B illustrate an exemplary method for forming field effect transistor (FET) devices.

DETAILED DESCRIPTION

The formation of the undercut (in step 3; described in the Description of Related Art section above) imposes a limitation on the density of circuits built with gate-all-around nanowire FET. The undercut size should be at least half of the width of the nanowires, or the nanowires may not be fully suspended by the etching. The undercut under the source (or drain) region should be smaller than half of the source (or drain) region width. If the source width is made narrower than two times the undercut size, the source (and drain) may not provide the anchoring for the suspended nanowires. The minimum width of the source and the drain dictates the area the device occupies. In addition to the circuit density limitation the presence of the undercut may lead to fabrication issues. The definition of the gate line (step 4) includes the removal of all the gate conductor material that was deposited in the cavity formed by the undercut. This is typically performed by an isotropic etch, which also etches the gate line. As a result, control of the gate line dimensions may be difficult to obtain.

Figures 1A, 1B:
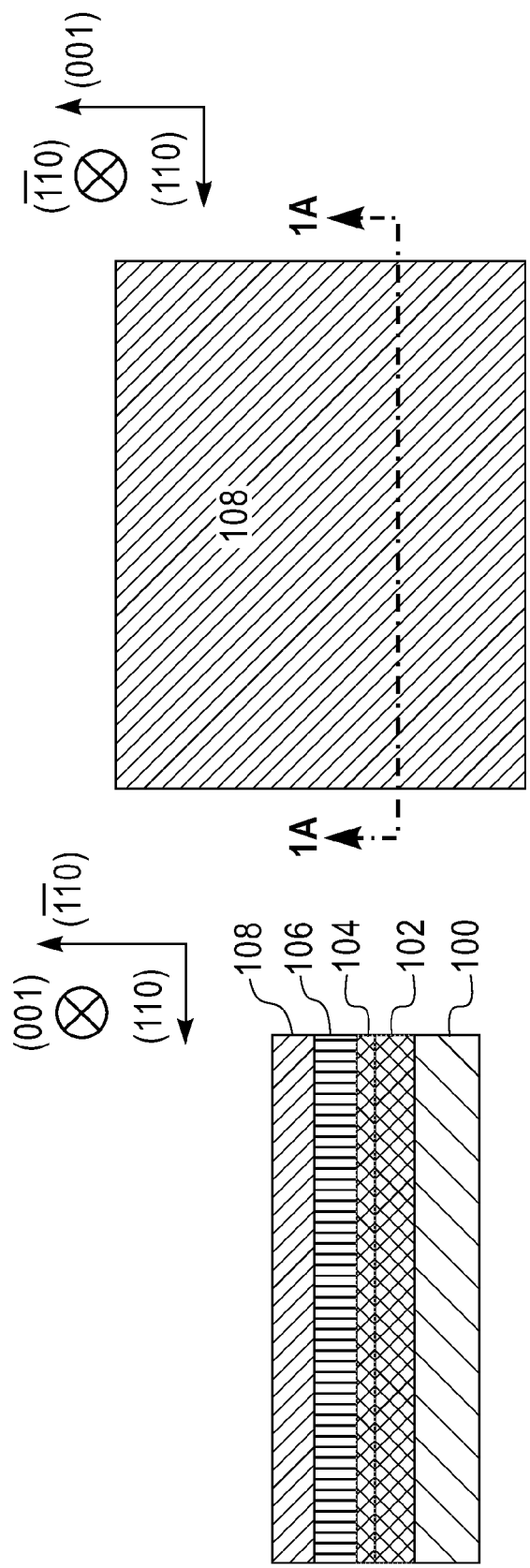

FIG. 1A illustrates a cross-sectional view along the line 1A (of FIG. 1B) and FIG. 1B illustrates a top down view of an exemplary method for forming a field effect transistor (FET) device. FIG. 1A includes a substrate 100 (for example a silicon substrate); a buried oxide (BOX) layer 102 disposed on the substrate 100; a silicon on insulator (SOI) layer 104 disposed on the BOX layer 102; a crystalline layer 106 such as, for example, a crystalline silicon germanium layer (SiGe)

disposed on the SOI layer 104; and a second silicon layer 108 disposed on the crystalline layer 106.

Figures 2A, 2B:
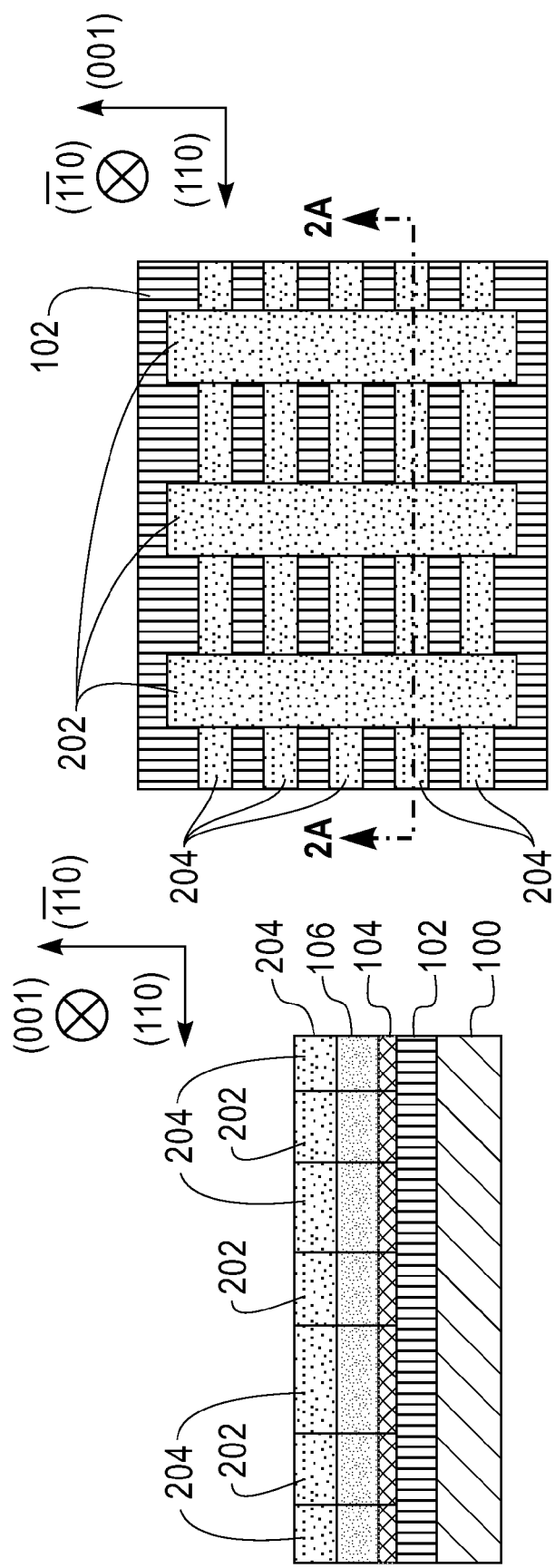

FIGS. 2A and 2B illustrate the resultant structure including anchor portions 202 and nanowire portions 204 that are patterned in the films stack formed by layers 104, 106, and 108. The anchor portions 202 and nanowire portions 204 may be patterned by the use of lithography followed by an etching process such as, for example, reactive ion etching (RIE). The etching process removes portions of the crystalline layer 108, 106, and the SOI layer 104 to expose portions of the BOX layer 102. The etched structure of FIG. 2B forms a ladder-like structure in which the rungs 204 have sidewalls parallel to the {100} crystal planes, and the anchors 202, which are connected by the rungs, have sidewalls parallel to the {110} crystal planes. In the example shown in FIG. 2B the rungs and the anchors forms a right angle)(90°, the top surface of layer 108 is therefore parallel to the {110} crystal planes. The specification for crystal planes directions follows the Miller indices convention which is described in, e.g., Ashcroft and Mermin, Solid State Physics, chapter 5 (1976), the contents of which are incorporated herein by reference. Following this convention a family of crystal planes, i.e. planes that are equivalent by the virtue of the symmetry of the crystal is typically referenced by a pair of { } parentheses. For example, the planes (100), (010) and (001) are all equivalent in a cubic crystal. One refers to them collectively as {100} planes. In yet another example the {110} planes refer collectively to the (110), (101), (011), planes.

Figures 3A, 3B:
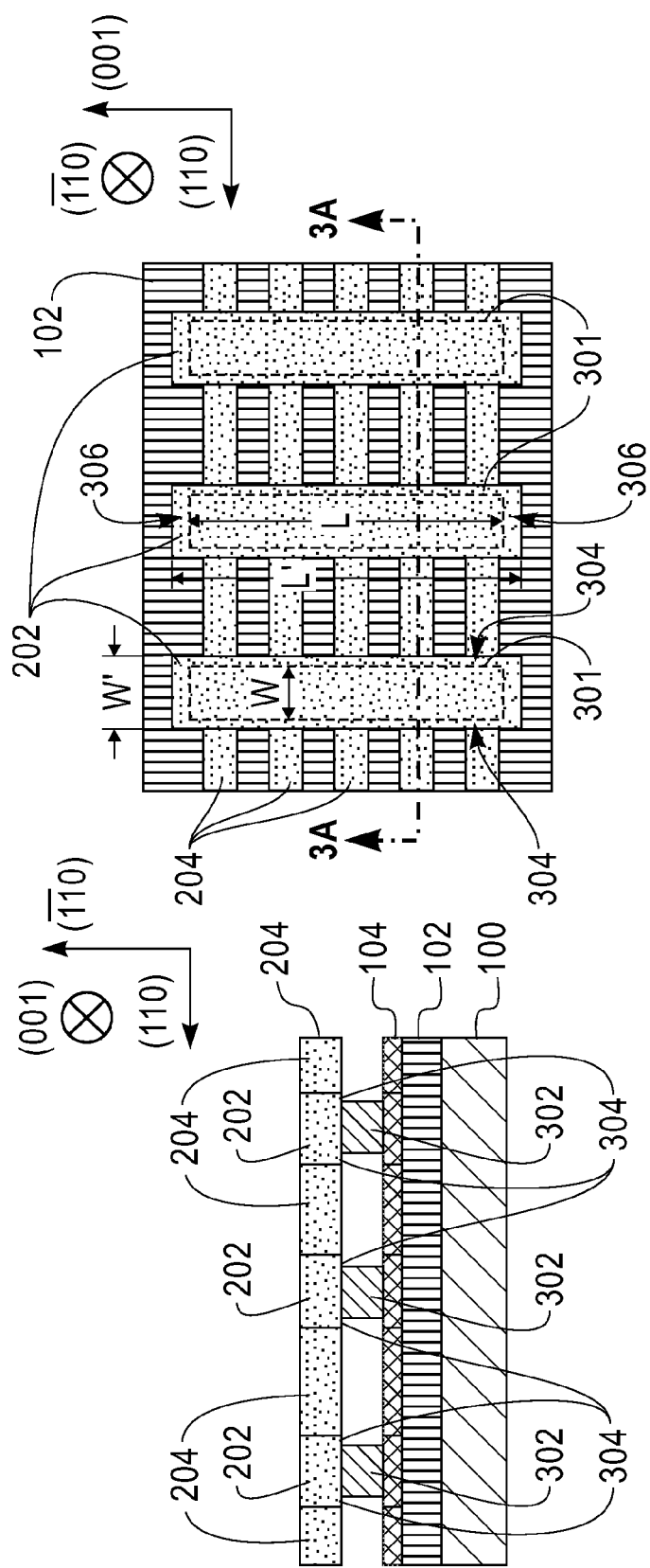

FIGS. 3A and 3B illustrate the resultant structure following an anisotropic etching process that selectively removes portions of the crystalline layer 106 resulting in pedestal portions 302 that are defined in the crystalline layer 106 that support the anchor portions 202. The anisotropic etching process removes the portions of the crystalline layer 106 that are orientated along the lattice plane {100} at a faster rate than the portions of the crystalline layer 106 that are orientated along the lattice plane {110}, resulting in the removal of the crystalline layer 106 that is below the nanowire portions 204, and the suspension of the nanowire portions 204 by the anchor portions 202. FIG. 3B illustrates the top-down profile of the pedestal portions 302 (illustrated by the dotted lines 301) that support the anchor portions 202. The width (w) of the pedestal portions 302 is less than the width (w') of the anchor portions 202, resulting in longitudinal overhang regions 304. The length (L) of the pedestal portions 302 is less than the length (L') of the anchor portions 202 resulting in transverse overhang regions 306. The anisotropic etching process results in the longitudinal overhang regions 304 having a smaller overhang length (W'−W)/2 than the transverse overhang (L'−L)/2 regions 306 due to the {100} planes etching faster than {110} planes in crystalline layer 106. The anisotropic etch exhibits chemical selectivity. The etch chemistry mainly removes the crystalline material 106 but does not substantively etch the crystalline material 108. For example, when layer 108 is silicon and layer 106 is SiGe, hot (gaseous) HCL can be used to selectively etch SiGe with little removal of Si. Additionally, HCL provides an anisotropic etching process as it etches faster the SiGe in the (100) orientation than in the (110) orientation. The etching is typically done when the wafer is kept a temperature of about 800° C.

FIGS. 4A and 4B illustrate the resultant structure following the formation of a thermal oxide layer 402 and 402A on the exposed anchor portions 202, nanowire portions 204, SOI layer 104, and pedestal portions 302. The oxidation process can be dry (with $O_2$) or wet (with $H_2O$ vapor), with typical oxidation temperature from 750° C. to about 1000° C. The thermal oxidation process completely oxidizes the SOI layer 104 due to the thin thickness of the SOI layer 104 relative to the thicknesses of the anchor portions 202, nanowire portions 204, and pedestal portions 302.

Figures 5A, 5B:
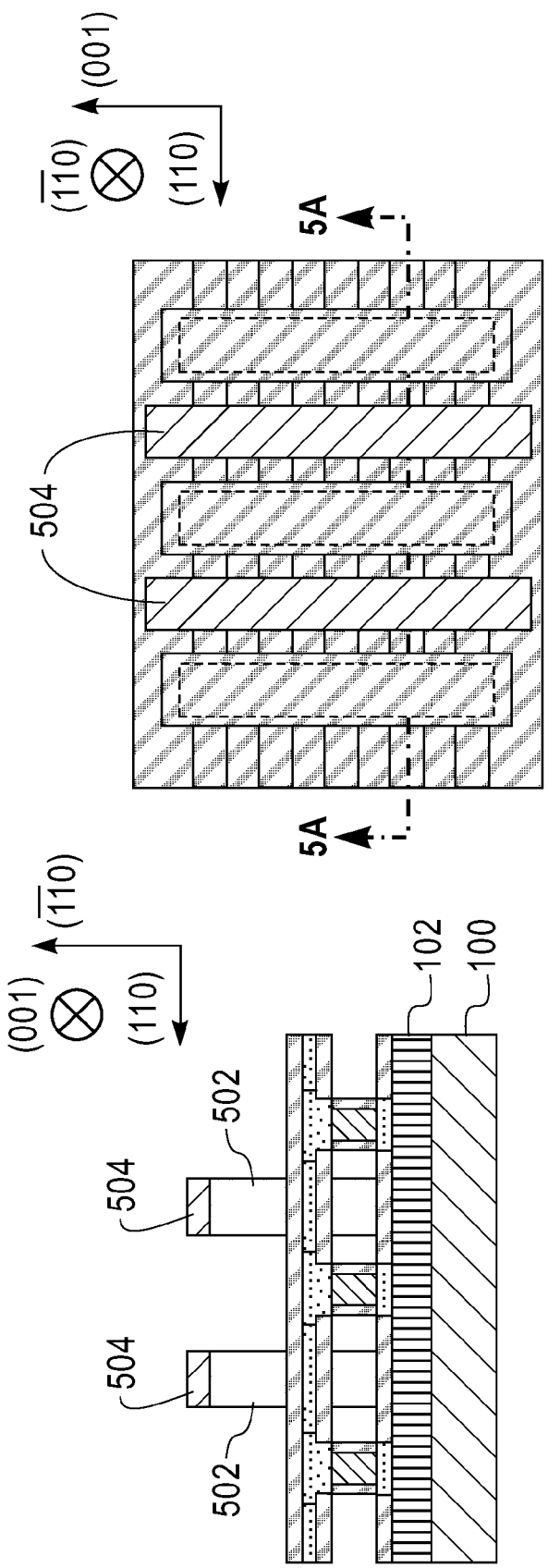

FIGS. 5A and 5B illustrate the resultant structure following the formation of polysilicon gates 502 and hardmask layers 504 such as, for example, silicon nitride ($Si_3N_4$) on the polysilicon gates 502. The polysilicon 502 and the hardmask layer 504 may be formed by depositing polysilicon material over channel regions of the nanowire portions 204, depositing the hardmask material over the polysilicon material, and etching by RIE to form the polysilicon gates 502 and the hardmask layers 504. The etching of the polysilicon gates 502 may be performed by directional etching that results in straight sidewalls of the gate 502. Following the directional etching, polysilicon 502 remains under the nanowire portions 204 and outside the region encapsulated by the gate 502. Isotropic etching may be performed to remove polysilicon 502 from under the nanowire portions 204.

Figures 6A, 6B:
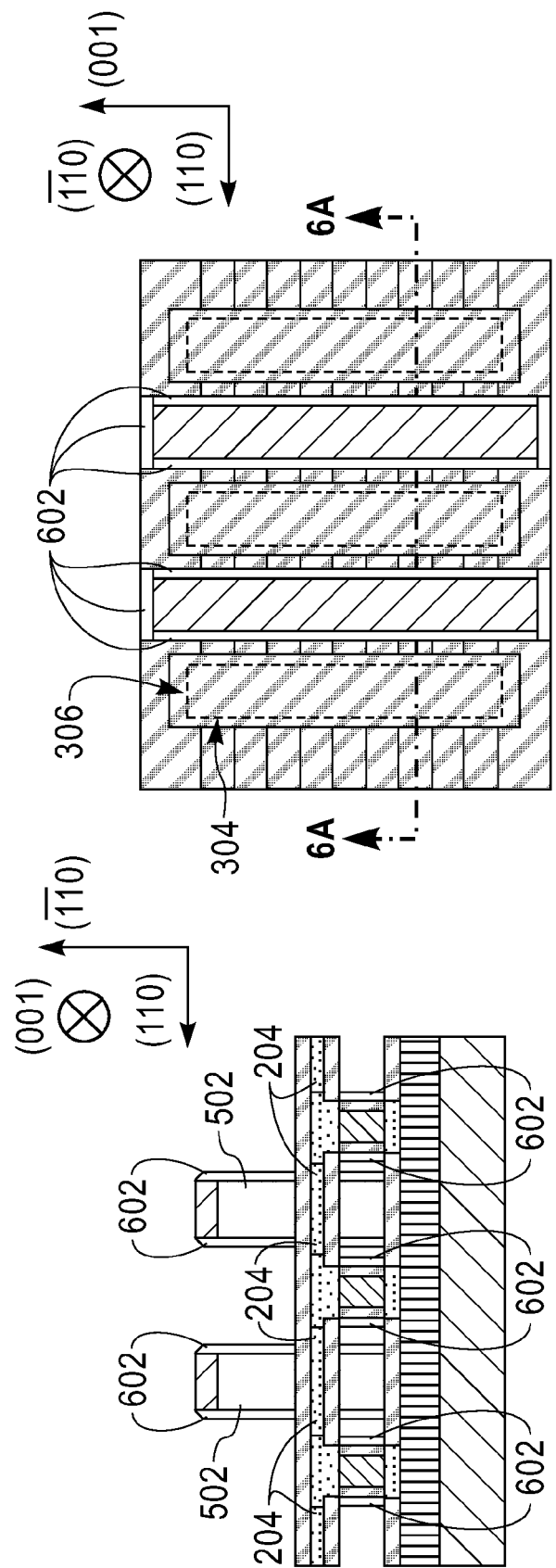

FIGS. 6A and 6B illustrate spacer portions 602 formed along opposing sides of the polysilicon gates 502. The spacers 602 are formed by depositing a blanket dielectric film such as silicon nitride and etching the dielectric film from horizontal surfaces by RIE. FIGS. 6A and 6B include spacer portions 602 that are formed under the nanowire portions 204, and below the overhang regions 304 and 306.

Figures 7A, 7B:
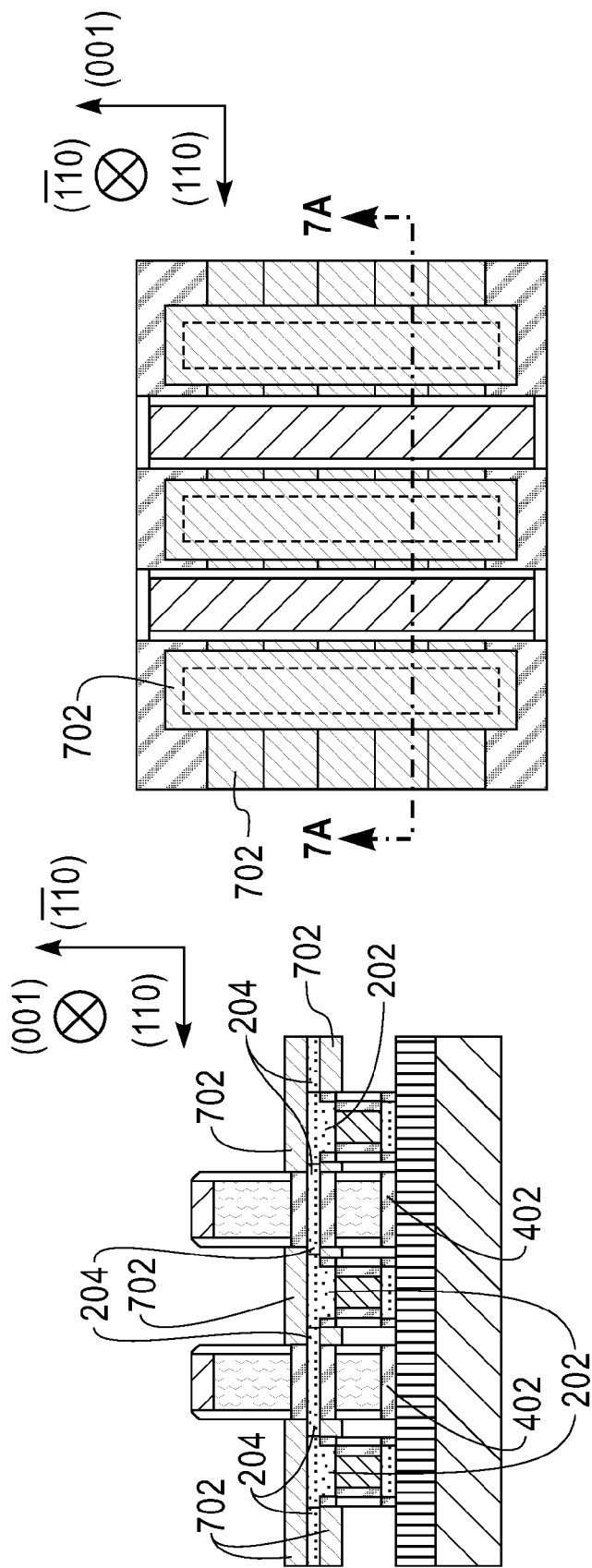

FIGS. 7A and 7B illustrate the resultant structures following a chemical etching process (such as etching with diluted HF) to remove the exposed portions of the thermal oxide layer 402 and a selective epitaxially grown silicon (epi-silicon) 702 that is grown on the exposed silicon of the anchor portions 202 and the nanowire portions 204. The epitaxy may include, for example, the deposition of in-situ doped silicon (Si) or silicon germanium (SiGe) that may be either n-type or p-type doped. The in-situ doped epitaxy process forms the source region and the drain region of the nanowire FET. As an example, a chemical vapor deposition (CVD) reactor may be used to perform the epitaxial growth. Precursors for silicon epitaxy include $SiCl_4$, $SiH_4$ combined with HCL. The use of chlorine allows selective deposition of silicon only on exposed silicon surfaces. A precursor for SiGe may include a mixture of $SiCl_4$ and $GeH_4$. For pure Ge epitaxy only $GeH_4$ is used, and deposition selectivity is typically obtained without HCL. Precursors for dopants may include $PH_3$ or $AsH_3$ for n-type doping and $B_2H_6$ for p-type doping. Deposition temperatures may range from 550° C. to 1000° C. for pure silicon deposition, and as low as 300° C. for pure Ge deposition.

Figures 8A, 8B:
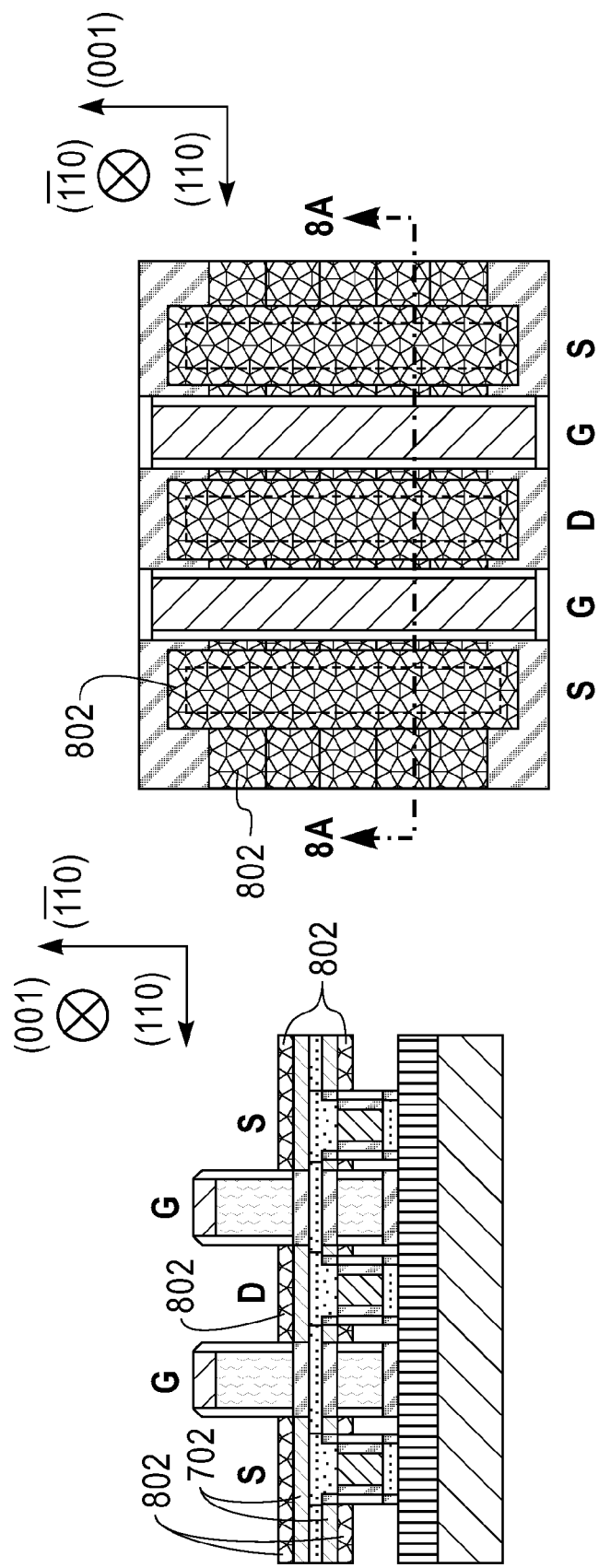

FIGS. 8A and 8B illustrate a resultant structure following silicidation where a silicide 802 is formed on the epi-silicon 702 of the anchor and the epi-thickened nanowire portions 202 and 204. Examples of silicide forming metals include Ni, Pt, Co, and alloys such as NiPt. When Ni is used the NiSi phase is typically formed due to its low resistivity. For example, formation temperatures include 400-600° C. Once the silicidation process is performed, capping layers and vias for connectivity (not shown) may be formed in the source (S), drain (D), and gate (G) regions of the device.

In an alternate exemplary method, high-K/metal gates may be formed on the nanowire portions 204. Referring to FIGS. 4A and 4B, the thermal oxide 402 around the nanowire portions 204 and along the sides of the pedestal portions 302 may be removed by an etching process. A chemical oxide material may be grown on the exposed silicon material, and high-K and gate metal layers are deposited conformally prior to the deposition and etching to form the polysilicon portions 502 and hardmask layers 504 (of FIGS. 5A and 5B). Once the polysilicon 502 and hardmask layers 504 are formed, etching may be performed to remove exposed metal gate material that is not covered by the polysilicon 502. Once the exposed metal gate material is removed, the method may continue as described in FIGS. 6A-8B above.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method comprising:
   depositing a first semiconductor layer on a substrate wherein a surface of the first semiconductor layer is parallel to {110} crystalline planes of the first semiconductor layer;
   epitaxially depositing a second semiconductor layer on the first semiconductor layer;
   etching the first semiconductor layer and the second semiconductor layer to define a nanowire portion that connects a first anchor portion to a second anchor portion, the nanowire portion having sidewalls that are parallel to {100} crystalline planes, the first anchor portion and the second anchor portion having sidewalls that are parallel to {110} crystalline planes; and
   performing an anisotropic etch that removes primarily material from {100} crystalline planes of the first semiconductor layer such that the nanowire portion is suspended by the first anchor portion and the second anchor portion.

2. The method of claim 1, wherein first semiconductor layer includes SiGe, and the second semiconductor layer includes silicon.

3. The method of claim 1, wherein substrate is a silicon-on-insulator (SOI) wafer comprising:
   a handle wafer;
   an insulator formed on the handle wafer; and
   a silicon-on-insulator formed on the insulator layer.

4. The method of claim 1 further comprising forming a gate-all-around the suspended nanowire portion.

5. The method of claim 3, further comprising oxidizing the silicon-on-insulator layer to form an insulator.

6. The method of claim 1, wherein performing an anisotropic etch include etching with hot gaseous HCL.

7. The method of claim 1, wherein anisotropic etch is chemically selective to primarily remove portions of the first semiconductor layer.

8. A method comprising:
   disposing a crystalline layer on a substrate;
   disposing a silicon layer on the crystalline layer;
   etching the portions of the silicon layer and the crystalline layer to define a nanowire portion in the silicon layer having a longitudinal orientation along a lattice plane (110) of the crystalline layer, the nanowire portion connected to a first anchor portion having a longitudinal orientation along a lattice plane (001) of the crystalline layer and a second anchor portion having a longitudinal orientation along the lattice plane (001) of the crystalline layer;
   anisotropically etching to primarily remove the crystalline layer under the nanowire portion and marginally etching a portion of the crystalline layer under the first anchor portion and a portion of the crystalline layer under the second anchor portion; and
   forming a gate structure on a channel region of the nanowire.

9. The method of claim 8, wherein the etching to remove the crystalline layer under the nanowire portion includes an anisotropic etching process that is operative to remove exposed portions of the crystalline layer having sidewalls parallel to lattice plane (100) at a faster rate than exposed portions of the crystalline layer having sidewalls parallel to lattice plane (110).

10. The method of claim 8, wherein the substrate includes a silicon on insulator (SOI) layer disposed on a buried oxide (BOX) layer, and the crystalline layer is disposed on the SOI layer.

11. The method of claim 10, wherein etching the portions of the silicon layer and the crystalline layer to define a nanowire portion in the silicon layer includes etching portions of the SOI layer.

12. The method of claim 10, wherein the method further includes oxidizing exposed portions of the nanowire portion, and the SOI layer prior to forming the gate structure.

13. The method of claim 12, wherein the method further includes removing the exposed oxidized portions of the nanowire portion and the SOI layer.

14. The method of claim 8, wherein the method further includes epitaxially growing a silicon material on the nanowire portion.

15. The method of claim 8, wherein an amount of anisotropically etching to primarily remove the crystalline layer under the nanowire portion and marginally etching a portion of the crystalline layer under the first anchor portion is controlled by crystalline orientation.

* * * * *